United States Patent [19]
Ando et al.

[11] Patent Number: 5,570,812
[45] Date of Patent: Nov. 5, 1996

[54] COMPONENT SUPPLY APPARATUS

[75] Inventors: Takashi Ando; Shuuichi Kubota, both of Kofu; Yoshihisa Tachiyama, Higashiyamanashi-gun; Kazuhiko Narikiyo, Kofu; Takao Naito, Nakakoma-gun, all of Japan

[73] Assignee: Matsushita Electric Industrial Co., Ltd., Osaka-fu, Japan

[21] Appl. No.: 377,241

[22] Filed: Jan. 24, 1995

[30]   Foreign Application Priority Data

Jan. 24, 1994 [JP] Japan .................................. 6-005962

[51] Int. Cl.⁶ ............................ B65H 9/06; H05K 13/00
[52] U.S. Cl. ...................... 221/233; 221/168; 221/211; 366/107; 414/755; 406/88; 406/137; 198/444
[58] Field of Search ............................ 414/755; 198/380, 198/493; 406/86, 88, 137; 221/168, 211, 233

[56]   References Cited

U.S. PATENT DOCUMENTS

| | | | |
|---|---|---|---|
| 4,451,182 | 5/1984 | Lenhart | 406/88 |
| 4,953,749 | 9/1990 | Kuboto et al. | 221/168 |
| 5,044,872 | 9/1991 | Hunt et al. | 414/755 |
| 5,083,654 | 1/1992 | Nakajima et al. | 198/493 |
| 5,122,016 | 6/1992 | Lenhart | 406/86 |

FOREIGN PATENT DOCUMENTS 5-218679  8/1993  Japan .

*Primary Examiner*—Karen B. Merritt
*Assistant Examiner*—Douglas Hess
*Attorney, Agent, or Firm*—Wenderoth, Lind & Ponak

[57]   ABSTRACT

A component supply apparatus includes a component feeding device for feeding components to a component feeding path, with the components arranged in a row while the components are being agitated by air, and a path forming member having a curved path extending from the component feeding path to a component supply position, for guiding the components fed from the component feeding path to the component supply position by changing a direction of each of the components by a predetermined angle. A plurality of air supply holes are provided at plural portions of the curved path for feeding the components fed to the curved path to the component supply position.

3 Claims, 7 Drawing Sheets

COMPONENT SUPPLY APPARATUS

BACKGROUND OF THE INVENTION

The present invention relates to a component supply apparatus and more particularly to a component supply apparatus for supplying various kinds of bulk components such as fine electronic components to a predetermined position by feeding them to a component feeding path, with the bulk components arranged in a row while they are agitated by air, for example, and then mounting them on an electronic circuit board by a component mounting apparatus.

There is a demand for a high speed supply of a large number of electronic components when the components are mounted on an electronic circuit board.

In order to comply with the demand, a method of feeding fine electronic components at a high speed by taping them is known. That is, electronic components are accommodated in accommodating portions formed on one side (surface) of an accommodating tape, with the electronic components arranged in the longitudinal direction thereof at regular intervals. A covering tape is bonded to the accommodating tape to prevent the components from being dropped from the accommodating portions.

Referring to FIG. 7, an example of a conventional component supply apparatus (B) is described below. The component supply apparatus (B) is used to automatically supply electronic components 205 accommodated in the accommodating tape to a mounting apparatus (A), positioned alongside of component supply apparatus (B), for mounting them on a printed circuit board 101, upon receipt thereof.

A plurality of the component supply apparatuses (B) corresponding to the number of kinds of the electronic components 205 required by the mounting apparatus (A) are installed on a component supply table 102 positioned alongside of the mounting apparatus (A). The component supply apparatus (B) holding the electronic components 205 required currently by the mounting apparatus (A) is selectively moved to a component supply position opposed to the mounting apparatus (A). Each of the electronic components 205 supplied to the component supply position by the component supply apparatus (B) is sucked by a sucking nozzle 104 provided on a component mounting head 103 of the mounting apparatus (A) and mounted on the printed circuit board 101 at a predetermined position thereof. The printed circuit board 101 is placed on an XY-table 106 movable in an X-direction and a Y-direction perpendicular to each other. The electronic component 205 sucked by the sucking nozzle 104 is transported to a mounting position to mount it on the printed circuit board 101 at the predetermined position thereof while the position of the XY-table 106 is being controlled in the XY-directions.

In the component supply apparatus (B), taped components 201 wound around a reel 105 supported by a supporting shaft 211 are pulled out therefrom along the upper surface of a component supply guide 202 and moved between the upper surface of the component supply guide 202 and pressing cover 203 covering the leading end of the component supply guide 202 toward a component supply hole formed on a pressing cover 203. While the taped components 201 are being moved, a covering tape 201b is separated from the accommodating tape 201a accommodating the electronic components 205 and then wound around a winding barrel of a reel 206. As a result, the accommodating tape 201a having the component accommodating portion uncovered as a result of the separation of the covering tape 201b is transported to the component supply hole. In this manner, the electronic components 205 are picked up sequentially by the sucking nozzles 104 through the component supply hole.

The above-described method of supplying the electronic components 205 requires: preparatory work for covering bulk components with the covering tape 201b after accommodating each of the bulk components in each component accommodating portion of the accommodating tape 201a; a mechanism for separating the covering tape 201b from the accommodating tape 201a and winding the covering tape 201b around the winding barrel of the reel 206; and work in removing the covering tape 201b from the winding barrel and disposing of it. The component supply apparatus requiring these works and the mechanism is complicated in its construction and inconvenient to use. In addition to the covering tape 201b, the accommodating tape 201a is frequently disposed after use. Thus, the component supply apparatus does not save resources.

In order to solve this disadvantage, the present applicants proposed a component supply apparatus (C) which is described below with reference to FIG. 1 (Japanese Laid-Open Patent Publication No. 5-218679). In this component supply apparatus, bulk components 205 are fed from a bulk component container 1 accommodating them separately to an agitating chamber 2. While agitating the bulk components 205 by air 3, the bulk components 205 are fed out to a component feeding path 4 formed according to the size of the bulk component 205, with the bulk components 205 arranged in a row. Then, each of the bulk components 205 is transported to a predetermined component supply position at which the bulk component is picked up by a sucking nozzle 104 shown in FIG. 7. The component supply apparatus (C) can be replaced with the above component supply apparatus (B).

The present applicant also proposed a component supply apparatus (Japanese Laid-Open Patent Publication No. 5-218679), as shown in FIG. 8, adopting the above-described shooting method wherein the bulk components 205 are supplied through the chute-like component feeding path 4. The apparatus has a plurality of recesses 302 formed along the periphery of a turn table 301. The recesses 302 receive the bulk components 205 fed from the component feeding path 4 by the shooting method. The bulk components 205 are picked up by the sucking nozzles 104 after the bulk components 205 are turned by 90° by the rotation of the turn table 301. In this manner, the bulk components 205 can be turned easily.

The above-described turn method makes the construction of the feeding path for feeding the bulk components 205 complicated. That is, this method requires a connecting path between a fixing section and a movable section. Further, there is a possibility that the bulk components 205 catch on the connecting path between the component feeding path 4 and the turn table 301, and thus the apparatus may be damaged.

SUMMARY OF THE INVENTION

The present invention has been developed with a view to substantially solving the above described disadvantages and its object is to provide an improved component supply apparatus having no connecting paths between a fixing section and a movable section and while capable of turning each of bulk components by a predetermined angle while each of them is being fed to a predetermined position.

In accomplishing these and other objects, according to one aspect of the present invention, there is provided a component supply apparatus comprising: a component feeding means for feeding components to a component feeding path, with the components arranged in a row while the components are being agitated by air; and a path forming member having a curved path, extending from the component feeding path to a component supply position, for guiding the components fed from the component feeding path to the component supply position by changing a direction of each of the components by a predetermined angle. A plurality of air supply holes are provided at plural portions of the curved path, for feeding the components fed to the curved path to the component supply position. According to another aspect of the present invention, there is provided a component supply apparatus comprising: a component feeding means for feeding components to a component feeding path, with the components arranged in a row while the components are being agitated by air; and a path forming member. The path forming member has an upstream feeding path extending from the component feeding path to guide the components and a downstream feeding path forming a predetermined angle with the upstream feeding path an extending from the upstream feeding path to a component supply position to guide the components from the upstream feeding path to the component supply position. A curved front side-guide face turns each of the components and guiding the component toward the downstream feeding path when a corner of a front end face of the component fed from the upstream feeding path, which does not confront the downstream feeding path is brought into contact with a bent portion positioned between the downstream feeding path and the upstream feeding path. A pressing means is positioned outside the component feeding path for pressing a side face in the vicinity of the front end face of the component to be turned along the front side-guide face toward the downstream feeding path. A curved rear side-guide face guides the component toward the downstream feeding path, with the rear side-guide face in contact with a rear end face of the component in cooperation with the front side-guide face.

BRIEF DESCRIPTION OF THE DRAWINGS

These and other objects and features of the present invention will become clear from the following description taken in conjunction with the preferred embodiments thereof and with reference to the accompanying drawings, in which.

DETAILED DESCRIPTION OF THE INVENTION

Figure 1:
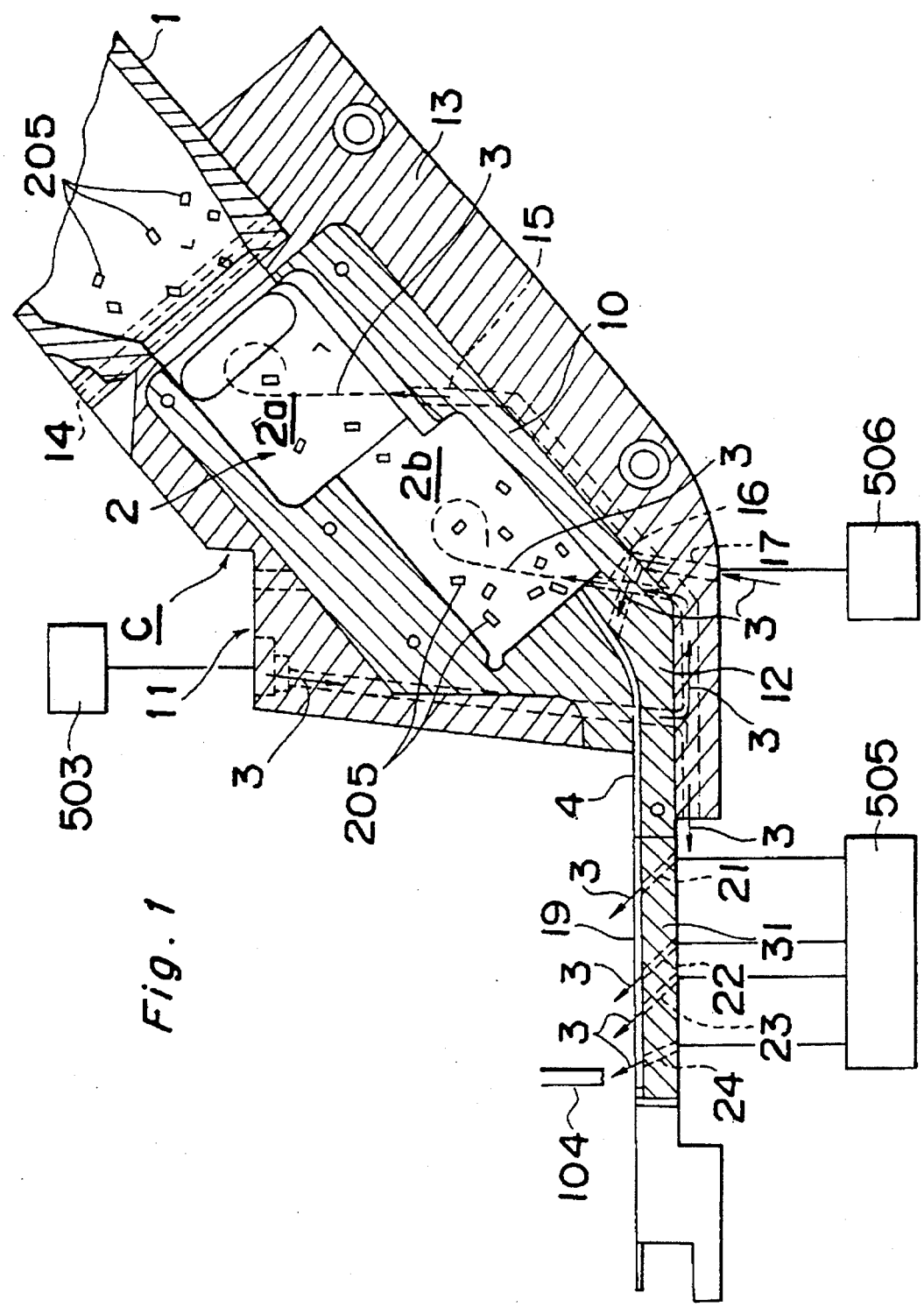
FIG. 1 is a sectional view showing a component supply apparatus according to a first embodiment of the present invention.

Before the description of the present invention proceeds, it is to be noted that like parts are designated by like reference numerals throughout the accompanying drawings.

A component supply apparatus according to a first embodiment of the present invention is described below with reference to FIGS. 1 through 4.

Figure 7:
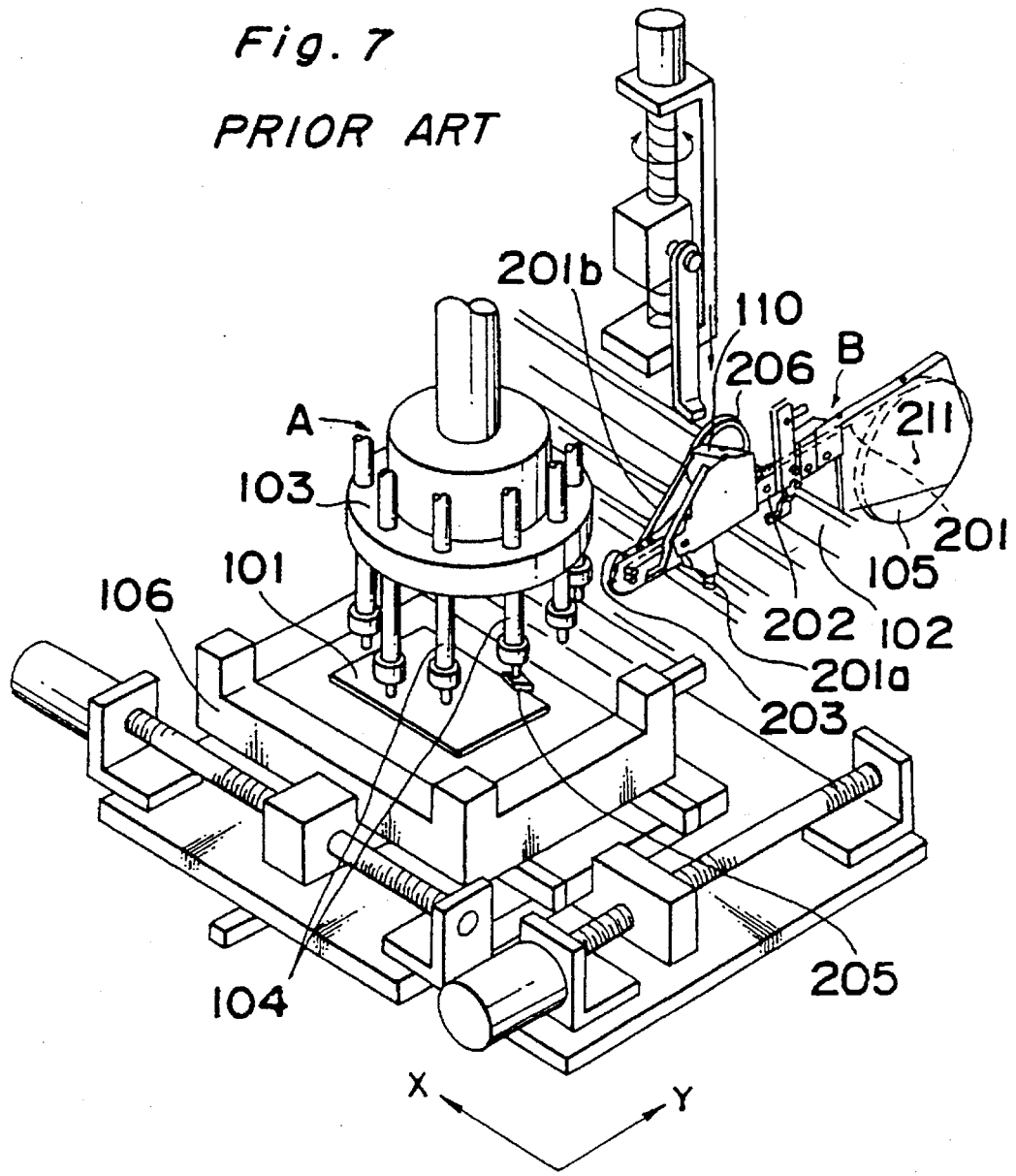
FIG. 7 is a perspective view showing an example of a conventional component supply apparatus handling taped components and a component mounting apparatus to which components are supplied.
Figure 8:
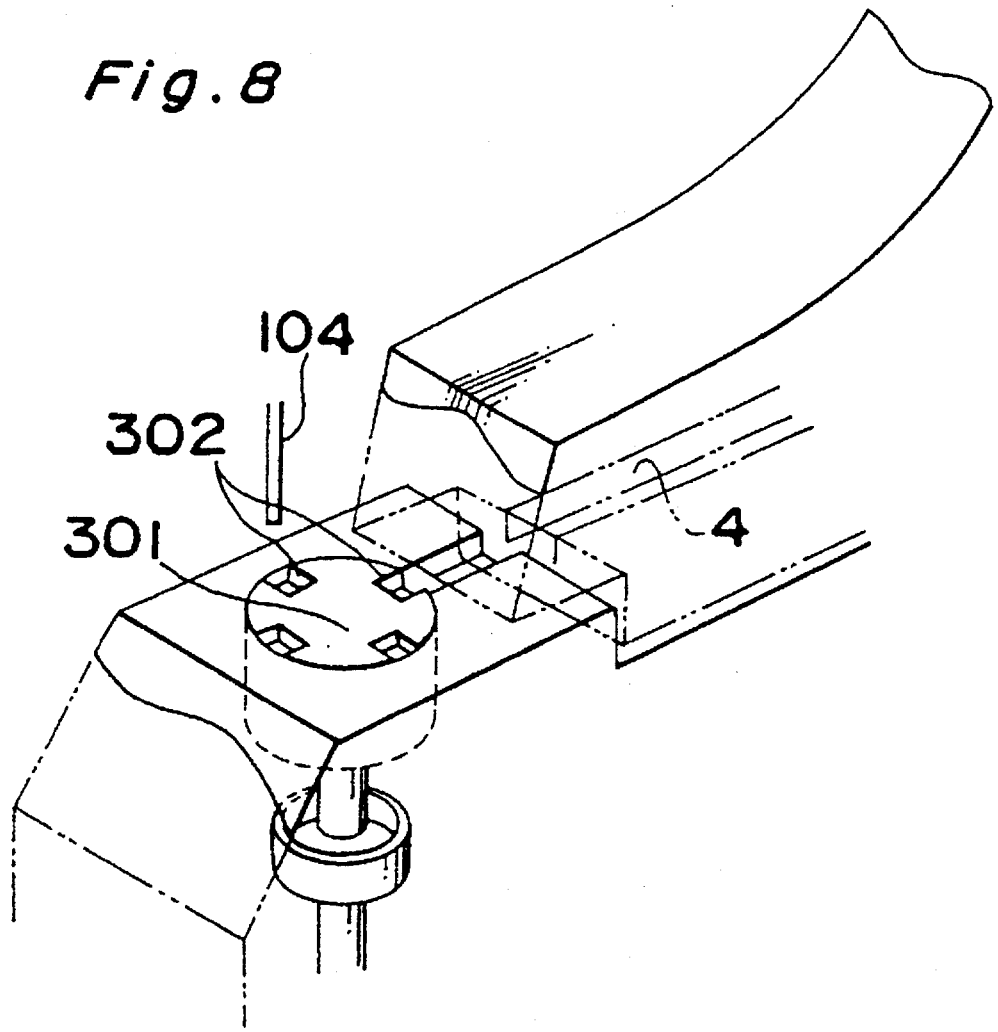
FIG. 8 is a perspective view showing a component turn section of a conventional component supply apparatus used for turning bulk components arranged in a row as a result of agitation by air in supplying them to a sucking nozzle.

The component supply apparatus (C) according to the first embodiment is suitable for supplying a mounting apparatus (A) as shown in FIG. 7 with bulk components 205 at a high speed. The component supply apparatus (C) is capable of supplying various kinds of bulk components to an apparatus except for the mounting apparatus (A).

Figure 2:
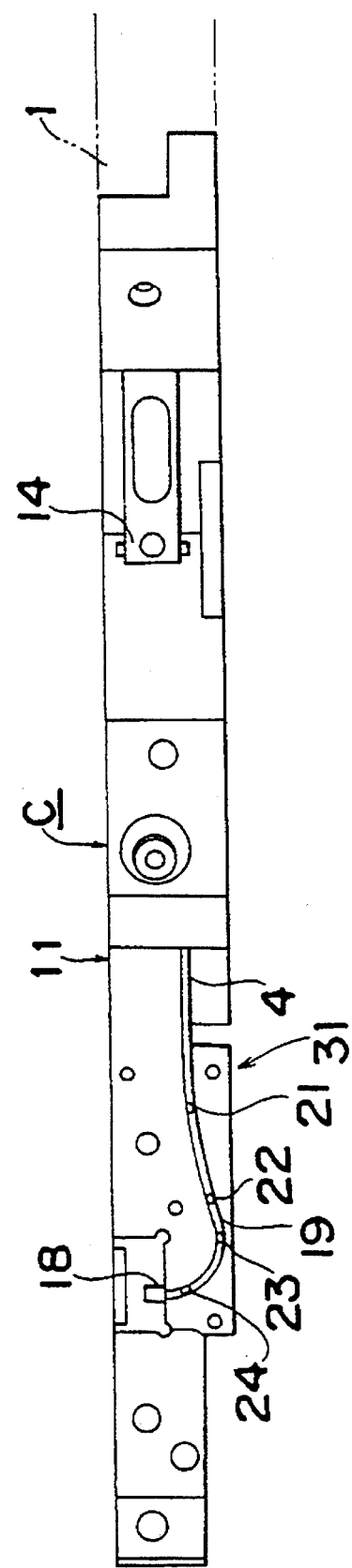
FIG. 2 is a plan view showing the component supply apparatus shown in FIG. 1.
Figure 3:
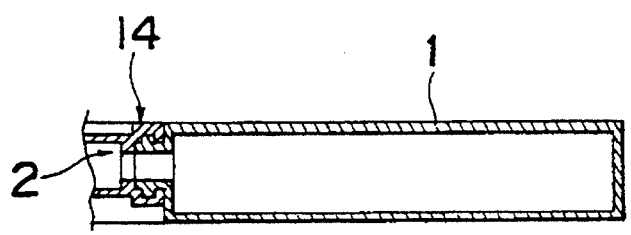
FIG. 3 is a cross sectional view showing a mounting portion on which a bulk component container of the component supply apparatus shown in FIG. 1 is mounted.

As shown in FIGS. 1 through 3, the component supply apparatus (C) comprises a component arranging/feeding device 11 on which a bulk component container 1 is mounted and a path forming member 31.

The component feeding device 11 intermittently agitates by air 3 the bulk components 205 introduced into an agitation chamber 2 from the bulk component container 1. Thus, when the air 3 stops agitating the components 205 in the agitation chamber 2, some of the agitated and dropped components 205 which have sectional areas of their side surfaces approximately in conformity with the sectional area of an opening of a component feeding path 4 in the agitation chamber 2 into the component feeding path 4 through the opening thereof and are then fed therethrough in a row.

The component feeding device 11 comprises a body 10 forming of the agitation chamber 2 and a path forming section 12 integral with the agitation chamber 2 and having the component feeding path 4 communicating with the agitation chamber 2. The body 10 is fitted into a cover 13. The path forming section 12 is partially projected from and positioned at a front portion of the cover 13. A dovetail groove 14 on which the bulk component container 1 is mounted is defined in a rear portion of the cover 13. This construction enables the component arranging/feeding device 11 having a complicated configuration and construction to be manufactured easily and the body 10 to be replaced according to the kind of bulk components 205.

This construction is not, however, essential to the present invention. For example, it is possible to define the dovetail groove 14 on the body 10. It is also possible to form the agitation chamber 2 of the body 10 separately from the path forming section 12 thereof. It is also possible to form the component supply apparatus (C) of a larger number of constituent sections than the above described sections. In addition, a plurality of constituent sections may be directly connected with each other not by using the cover 13.

The agitation chamber 2 comprises upper and lower chambers 2a and 2b positioned stepwise and obliquely downwardly of the bulk component container 1 toward the path forming section 12. Air inlets 15 and 16, penetrating through the cover 13 and the path forming section 12, introduce the air 3 obliquely backwardly into each of the chambers 2a and 2b from the vicinity of the front end of each chamber 2a, 2b. An air inlet 17, penetrating through the path forming section 12, introduces the air 3 obliquely forwardly into the component feeding path 4 from the bottom of the base of the component feeding path 4. The bulk components 205 are introduced into the component feeding path 4 in the longitudinal direction thereof while the bulk components 205 are being agitated by the air 3 in the agitation chamber 2, and are then fed to a component supply opening 18 positioned at the leading end of the component feeding path 4, with the bulk components 205 arranged in a row. At the component supply opening 18, the components are picked up sequentially by the sucking nozzles 104. But the conditions for agitating and feeding the bulk components 205 may be varied appropriately according to the kinds, configurations, and sizes of the bulk components 205.

A path forming member 31 is connected to the path forming section 12 and has a curved path 19 provided in communication with the component feeding path 4. That is, the curved path 19 extending from the component feeding path 4 to the component supply opening 18 guides the bulk components 205 fed from the component feeding path 4 to the component supply opening 18 by changing the direction of each bulk component 205 by a predetermined angle of 90°. The direction of the bulk components 205 may be changed by more than 90° or less than 90° as necessary. In addition, air supply holes 21 through 24 for feeding the bulk components 205 fed to the curved path 19 to the component supply opening 18 are formed along the curved path 19.

In this construction, the curved path 19 extending from the component feeding path 4 to the component supply opening 18 guides the bulk components 205 fed from the component feeding path 4 to the component supply opening 18 by changing the direction of each bulk component 205 by 90°. The bulk components 205 are pressed and transported sequentially toward the component supply opening 18 along the curved path 19 with the assistance of the air 3 blown into the curved path 19 from the air supply holes 21 through 24. Accordingly, the bulk component 205 can be fed to the component supply opening 18 by changing the direction of each bulk component 205 smoothly while the bulk components 205 are being transported along the curved path 19, without providing a connecting path between a fixing section of the component supply apparatus and a movable section thereof. That is, the construction of the component feeding path 4 communicating with the curved path 19 is simple because no connecting paths are provided between the fixing section and the movable section. Hence, there is no trouble between the fixing section and the movable section, whereas in the conventional component supply apparatus, there is a possibility that the bulk component 205 catches on the connecting path between the fixing section and the movable section. In particular, there is no need for providing a driving means for turning the bulk component 205 and hence a control means for controlling the operation of the driving means.

The curved path 19 is constituted of a material 31 separate from that of the component feeding path 4 formed in the path forming section 12 so as to facilitate the manufacture of the curved path 19. But this construction does not require the formation of a connecting path between the fixing section of the component supply apparatus and its movable section.

It is possible to form the component feeding path 4 and the curved path 19 in integration with each other to reduce the number of constituent parts or sections and assembling processes.

Figure 4:
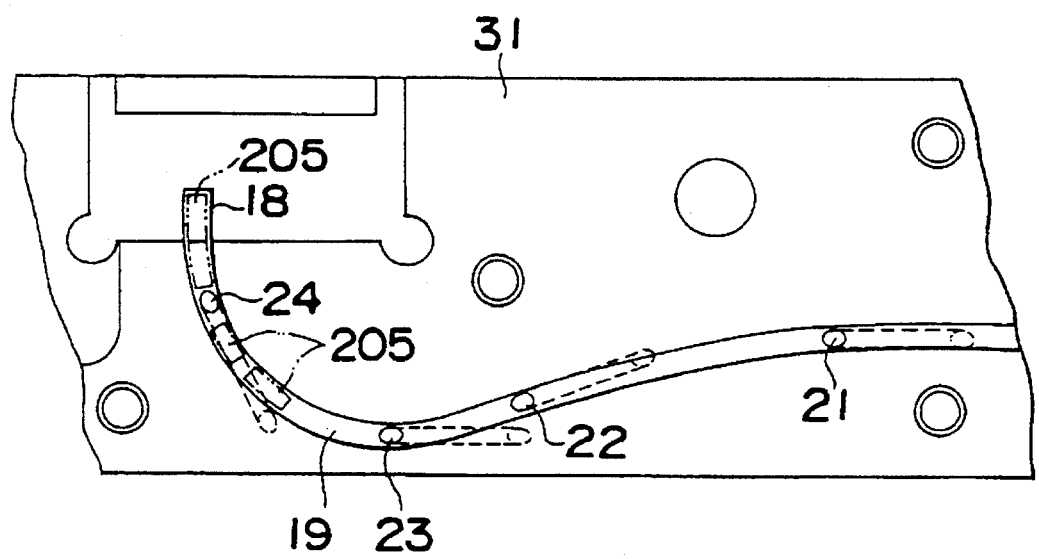
FIG. 4 is a plan view showing a component feeding path of the component supply apparatus shown in FIG. 1 and a curved path thereof.

The air supply holes 21 through 24 are so inclined that the air supply holes 21 through 24 introduce the air 3 obliquely forwardly into the curved path 19 to move the bulk components 205 sequentially toward the component supply opening 18 along the bottom surface of the curved path 19. That is, each of the air supply holes 21 through 24 is inclined upwardly such that it forms a certain angle with the tangent to the curve of the curved path 19 at the location of each of the air supply holes 21 through 24 as shown in FIG. 4.

The inclinations of the air supply holes 21 through 24 allow the bulk components 205 to be moved forward smoothly along the curved path 19, without the inner surface of the curved path 19 being caught by the bulk components 205, and allow the bulk components 205 to be turned smoothly.

The air 3 is supplied to the air inlets 15, 16 by an air pump 503, to the air inlet 17 by an air pump 506, and to the air supply holes 21 through 24 by an air pump 505. But the air 3 can be supplied to the air inlets 15, 16, 17 and the holes 21 through 24 by one air pump.

In the first embodiment, the upper portion of the component feeding path 4 and that of the curved path 19 are open. But they may be closed to prevent the very small and light bulk components 205 from being dropped from the component feeding path 4 or the curved path 19 when the bulk components 205 are blown by the air 3. In this case, it is necessary to set the clearance between the cover and the component feeding path 4 as well as the curved path 19 appropriately so that the component feeding path 4 or the curved path 19 is not clogged with the bulk components 205. If the bulk components 205 are so flat and strip-like that they are hardly changed or not changed in the posture thereof while they are being transported, there may be a large clearance between the cover and the component feeding path 4 as well as the curved path 19.

Further, it is possible to provide the component supply opening 18 with a shutter to prevent the bulk component 205 from being dropped from the curved path 19. In this case, the component supply opening 18 can be opened only when the sucking nozzle 104 picks up the bulk component 205, as in the case of the conventional component supply apparatus (B).

Figure 5:
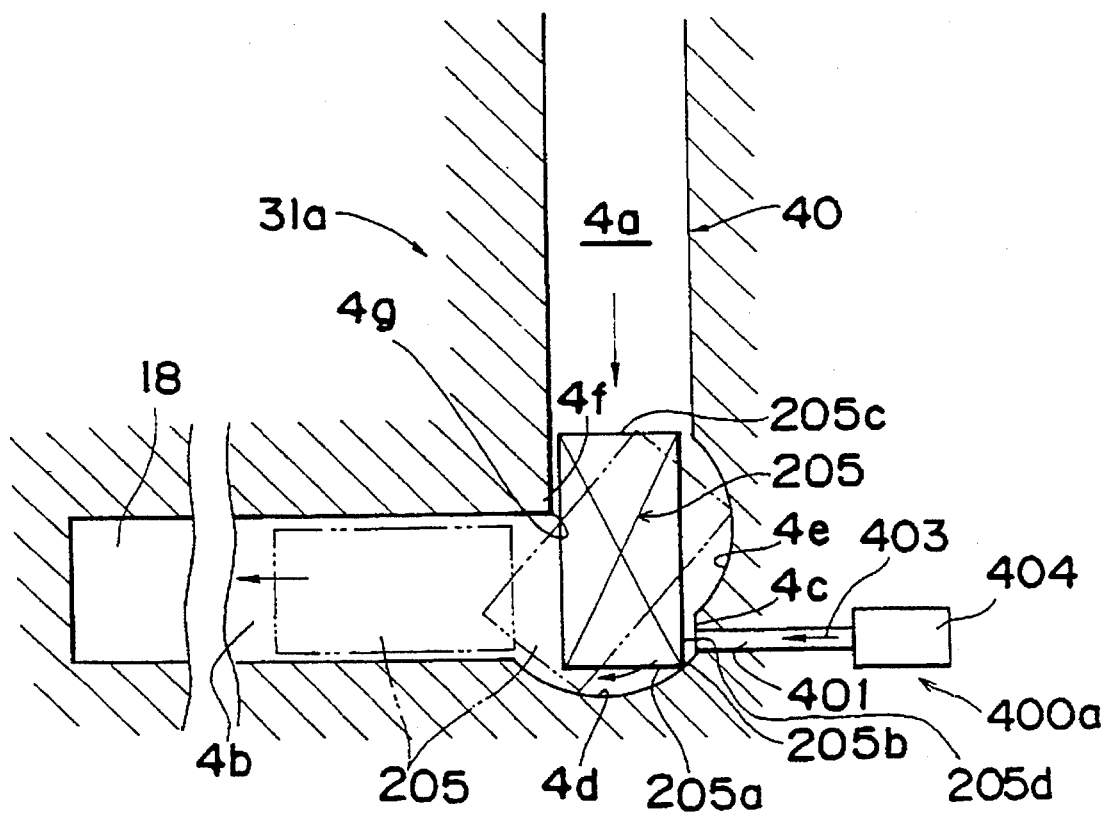
FIG. 5 is a sectional plan view showing a component supply path according to a second embodiment of the present invention.

A component supply apparatus (C) according to a second embodiment of the present invention is described below with reference to FIG. 5.

The component feeding path 40 comprises a path forming member 31a connected to the path forming section 12 of the component feeding device 11 which has an upstream feeding path 4a and a downstream feeding path 4b forming 90° angle with the upstream feeding path 4a without the provision of the curved path 19.

The component supply apparatus comprises a curved front side-guide face 4d for turning the bulk component 205 and guiding it toward the downstream feeding path 4b when a corner 205b, of a front end face 205a of each bulk component 205 fed from the upstream feeding path 4a, which does not confront the downstream feeding path 4b, is brought into contact with a bent portion 4c positioned between the downstream feeding path 4b and the upstream feeding path 4a. A pressing means 400a, positioned outside the component feeding path 40, is composed of a device for pressing a side face 205d of the bulk component 205 to allow the front end face 205a of the bulk component 205 to be turned along the front side-guide face 4d toward the downstream feeding path 4b by blowing air 403 from an air supply opening 401 to the side face 205d in the vicinity of the corner 205b of the bulk component 205. A curved rear side-guide face 4e guides the bulk component 205 toward the downstream feeding path 4b, with the rear side-guide face 4e in contact with a rear end face 205c of the bulk component 205, in cooperation with the front side-guide face 4d. The air 403 is supplied to the air supply opening 401 by an air pump 404.

In the component supply apparatus according to the second embodiment, the downstream feeding path 4b forms 90° angle with the upstream feeding path 4a. When the bulk component 205 has been fed from the upstream feeding path 4a to the bent portion 4c positioned between the downstream feeding path 4b and the upstream feeding path 4b, the curved front side-guide face 4d of the bent portion 4c is brought into contact with only the corner 205c of the front end face 205a of the bulk component 205, which does not confront the downstream feeding path 4b, thus turning the bulk component 205 and guiding it toward the downstream feeding path 4b. In addition, the pressing means 400a, positioned outside the component feeding path 40, presses the side face 205d to allow the front end face 205a of the bulk component 205 to be turned toward the downstream feeding path 4b while the bulk component 205 is being turned along the front side-guide face 4d, thus turning the bulk component 205 in cooperation with the front side-guide face 4d and the rear side-guide face 4e. In contact with the rear end face 205c of the bulk component 205, the rear side-guide face 4e turns the bulk component 205 by 90°, thus guiding it toward the downstream feeding path 4b, in cooperation with the front side-guide face 4d.

The above-described construction of the component feeding path 40 allows the bulk component 205 to be turned smoothly during the transportation thereof along the component feeding path 40 and the bulk component 205 to be fed to the component supply opening 18 smoothly, without the connecting path between the fixing and movable sections. Further, in the component supply apparatus according to the second embodiment, the connecting path is not provided between the fixing section and the movable section to make the apparatus (C) simple, and additionally, unlike the conventional apparatus, there is no possibility that the bulk components 205 catch on the connecting path.

In the second embodiment, the component feeding path 40 is so designed that a corner 4f of the component feeding path 40 opposed to the bent portion 4c thereof generally functions as a fulcrum 4g for the bulk component 205 to be turned by a predetermined angle, and the center of the circular arcs of the front side-guide face 4d and the rear side-guide face 4e is approximately the fulcrum 4g. This construction allows the bulk component 205 to be turned easily and reliably. That is, the front side-guide face 4d and the rear side-guide face 4e are so designed that the front side- and rear side-guide faces 4d and 4e are symmetrical with respect to the line connecting the corner 4f and the bent portion 4c with each other. This construction can be designed and manufactured easily.

Figure 6:
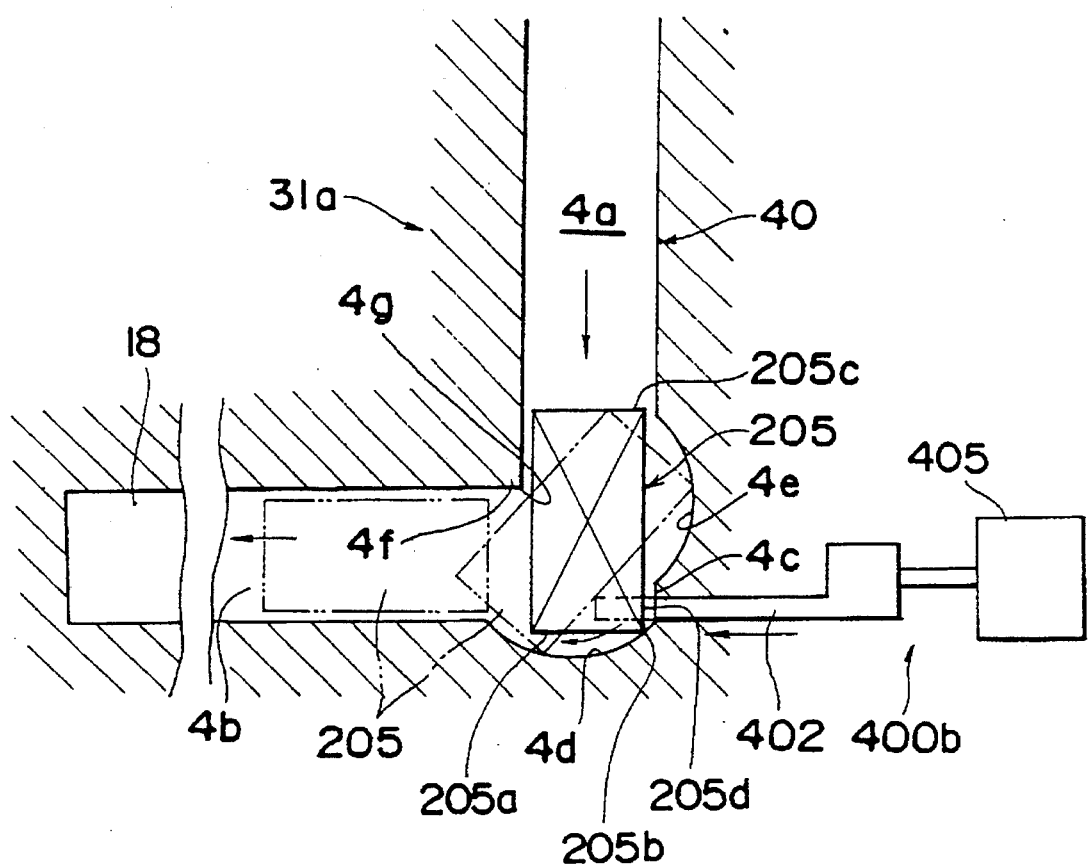
FIG. 6 is a sectional plan view showing a component supply path according to a third embodiment of the present invention.

The pressing means 400a according to the second embodiment is composed a device for pressing the bulk component 205 toward the downstream feeding path 4b by blowing air 403 from an air supply opening 401 to the side face 205d in the vicinity of the corner 205b of the front end face 205a of the bulk component 205 which does not confront the downstream feeding path 4b. Referring to FIG. 6 showing the component feeding path 40 according to a third embodiment of the present invention, a pressing means 400b is composed of a pressing member 402 and a driving cylinder 405 instead of the device of the pressing means 400a. By the driving cylinder 405, the pressing member 402 is moved from the outside of the component feeding path 4 to the side face 205d in the vicinity of the corner 205b of the front end face 205a of the bulk component 205 which does not confront the downstream feeding path 4d, thus pressing the bulk component 205 toward the downstream feeding path 4b. The pressing means 400b is also capable of smoothly turning the bulk component 205 at the corner between the upstream feeding path 4a and the downstream feeding path 4b. The pressing means 400a having the construction of blowing the air 403 to the bulk component is simpler than the pressing means 400b for moving to the bulk component 205 by the pressing member 402.

In the above-described embodiments, the bulk component 205 is turned by 90° to supply it to the component supply opening 18. But the bulk component 205 may be turned by more than 90° or less than 90° as necessary.

If the component feeding path 4 is so formed that the bulk component 205 is turned by more than 90° in the second and third embodiments, the bent portion 4c is formed at two or more positions to facilitate the turn of the bulk component 205.

In the component supply apparatus according to the present invention, the component arranging/feeding means agitates the bulk components by the air, thus feeding them to the component feeding path, with the bulk components arranged in a row.

According to the construction of the first embodiment of the present invention, the curved path extending from the component feeding path to the component supply position guides the bulk components fed from the component feeding path to the component supply position by changing the direction of each of the bulk components by the predetermined angle. The bulk components are pressed and transported sequentially toward the component supply position along the curved path with the assistance of the air blown into the curved path from the air supply holes. Accordingly, each of the bulk components can be fed to the component supply position by smoothly turning the direction of each of the bulk components, for example, 90° while the bulk components are being transported along the component feeding path and the curved path, without providing the component supply apparatus with a connecting path between a fixing section thereof and a movable section thereof. That is, the construction of the component feeding path communicating with the curved path is simple because no connecting paths are provided between the fixing section and the movable section. Hence, there is no trouble between the fixing section and the movable section, whereas in the conventional component supply apparatus, there is a possibility that the bulk components catch on the connecting path between the fixing section and the movable section. In particular, there is no need for providing a driving means for turning the bulk components and hence a control means for controlling the operation of the driving means.

Each of the air supply holes is inclined obliquely towards the component supply position such that it forms a certain angle with the tangent to the curve of the curved path at the location of each of the air supply holes. The inclinations of the air supply holes allow the bulk components to be transported forward smoothly along the curved path, without the bulk components catching on a portion positioned subsequently to the curved path, and the bulk components to be turned smoothly.

According to the construction of the second and third embodiments of the present invention, the downstream feeding path forms the predetermined angle with the upstream feeding path. When each of the bulk components has been fed from the upstream feeding path to the bent portion positioned between the downstream feeding path and the upstream feeding path, the curved front side-guide face of the bent portion is brought into contact with the corner of the front end face of the bulk component which does not confront the downstream feeding path, thus turning the bulk component and guiding it toward the downstream feeding path. In addition, the pressing means, positioned outside the component feeding path, presses the front end face of the bulk component to be turned along the front side-guide face toward the downstream feeding path, thus turning the bulk component in cooperation with the curved front side-guide face and the curved rear side-guide face. In contact with the rear end face of the bulk component, the curved rear side-guide face turns the bulk component by the predetermined angle, thus guiding it toward the downstream feeding path, in cooperation with the front side-guide face. The above-described construction of the component feeding path allows each of the bulk components to be turned smoothly by the predetermined angle, for example, 90° while they are being transported along the component supply path toward the component supply position. Further, the connecting path is not provided between the fixing section and the movable section, and unlike the conventional component supply apparatus, there is no possibility that the bulk component catch on the connecting path, thus preventing any damage.

The pressing means, positioned outside the component feeding path, may be composed of a device for blowing air to the corner of the front end face of the bulk component which does not confront the downstream feeding path, or a pressing device to be moved to the corner of the front end face of the bulk component which does not confront the downstream feeding path. The pressing means composed of these devices are capable of turning the bulk component smoothly at the corner between the upstream feeding path and the downstream feeding path. The pressing means composed of the device for blowing the air to the bulk component is simpler than that of the pressing device to be moved to the bulk component.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component supply apparatus comprising:

a component feeding path;

a component feeding means for feeding components to said component feeding path so as to be arranged in a row while the components are being agitated by air; and a path forming member comprising:

an upstream feeding path extending from said component feeding path in order to guide components therefrom, a downstream feeding path forming a predetermined angle with said upstream feeding path and extending from said upstream feeding path to a component supply position in order to guide the components from said upstream feeding path to the component supply position, a bent portion positioned between said downstream feeding path and said upstream feeding path, a curved front side-guide face for turning each of the components and guiding the component toward said downstream feeding path when a corner or a front end face of the component, fed from said upstream feeding path, which does not confront said downstream feeding path is brought into contact with said bent portion, a pressing means positioned outside said component feeding path and said upstream and downstream feeding paths for pressing a side face of the component in the vicinity of the front end face of the component so as to turn the component along said front side-guide face toward said downstream feeding path, and a curved rear side-guide face for guiding the component toward said downstream feeding path in cooperation with said front side-guide face by contacting a rear end face of the component;

wherein said pressing means comprises a device to be moved to the corner of the front end face of the component which does not confront said downstream feeding path.

2. A component supply apparatus comprising:

a component feeding path;

a component feeding means for feeding components to said component feeding path, said component feeding means comprising an agitation chamber in which the components are intermittently agitated by air, said agitation chamber having an opening therein to said component feeding path for feeding components out of said agitation chamber to said component feeding path with the components arranged in a row;

a path forming member having a curved path extending from said component feeding path to a component supply position for guiding the components fed from said component feeding path to the component supply position by changing a direction of each of the components by a predetermined angle and an air supply hole for feeding the components fed to said curved path to the component supply position; and one air pump for supplying air to both the air supply hole and to said agitation chamber, thereby intermittently agitating the components in said agitation chamber so that when the supply of agitating air to said agitation chamber is stopped intermittently, some of the agitated components in said agitation chamber of said component feeding means which have sectional areas of their side surfaces in approximate conformation with a sectional area of said opening to said component feeding path drop and come into said component feeding path through said opening and are then fed through said component feeding path in a row.

3. The component supply apparatus of claim 2, wherein said air supply hole is inclined towards said component supply position such that said air supply hole forms a certain angle with a tangent to the curve of said curved path at said air supply hole.

* * * * *